United States Patent [19]

Wheatley, Jr.

[11] 4,051,441
[45] Sept. 27, 1977

[54] TRANSISTOR AMPLIFIERS

[75] Inventor: Carl Franklin Wheatley, Jr., Somerset, N.J.

[73] Assignee: RCA Corporation, New York, N.Y.

[21] Appl. No.: 688,578

[22] Filed: May 21, 1976

[51] Int. Cl.² .......................... H03F 3/04; H03G 3/10
[52] U.S. Cl. ...................................... 330/288; 330/278
[58] Field of Search ...................... 330/23, 29, 38 M; 307/310

[56] References Cited

U.S. PATENT DOCUMENTS 3,286,138  11/1966  Shockley ........................ 307/310 X Primary Examiner—James B. Mullins
Attorney, Agent, or Firm—H. Christoffersen; S. Cohen; A. L. Limberg

[57] ABSTRACT

The collector currents of first and second junction transistors which have base electrodes biased at the same quiescent potential and have emitter electrodes connected via respective emitter degeneration resistances to a common point, are adjusted relative to each other. This is done by applying temperature-independent currents in adjustable ratio with each other to the emitter degeneration resistances. The resistances have temperature coefficients of $1/T_O$ to make the adjustment of the collector currents substantially unchanging for a range of temperatures around $T_O$.

6 Claims, 8 Drawing Figures

TRANSISTOR AMPLIFIERS

The present invention relates to transistor amplifiers having adjustable current gains or relative quiescent current levels and more particularly to such amplifiers susceptible of fabrication in mostly monolithic integrated circuit form, in which the adjustments are not substantially affected by temperature change.

Certain prior art transistor amplifiers, either of the current mirror type or the emitter-coupled differential amplifier type, commonly employ first and second transistors with their emitter electrodes connected to a common point by respective emitter degeneration resistances and having essentially equal quiescent potentials applied to their base electrodes to forward-bias their base-emitter junctions. It has been common practice in the prior art to adjust the relative transconductance of these transistors by a potentiometer connected at its two ends to the two transistor emitter electrodes, respectively, and at its adjustable tap-point terminal to the common point. The potentiometer provides push-pull trim of the two emitter degeneration resistances for adjusting the relative amounts by which the transistors are degenerated by current feedback, thereby adjusting the relative transconductances of the transistors.

The shortcoming of this practice is that the temperature of the potentiometer is not easily constrained to change in the same manner as the temperature of the emitter degeneration resistors, nor does the resistance of the potentiometer exhibit a temperature coefficient similar to that of the emitter degeneration resistances. As a result, the current gain adjustment with this prior art method tends to be undesirably temperature-sensitive. Precisely correct current gain is achieved only at a specific transistor operating temperature.

In a transistor amplifier embodying the present invention, the emitter degeneration resistances are such as to have coefficients of change in their resistances with change in absolute temperature of an absolute value approximately equal to $1/T_0$ in a range of absolute temperatures including $T_0$. Each emitter degeneration resistance has a respective current source in loop connection therewith, which sources supply substantially temperature-independent currents. At least one of these current sources is adjustable so the difference in the currents they supply may be changed in value to control the ratio of collector currents of the first and second transistors. This ratio is maintained substantially constant despite changes in the absolute temperature near which the first and second transistors and their respective emitter degeneration resistances are all operated.

Figure 1:
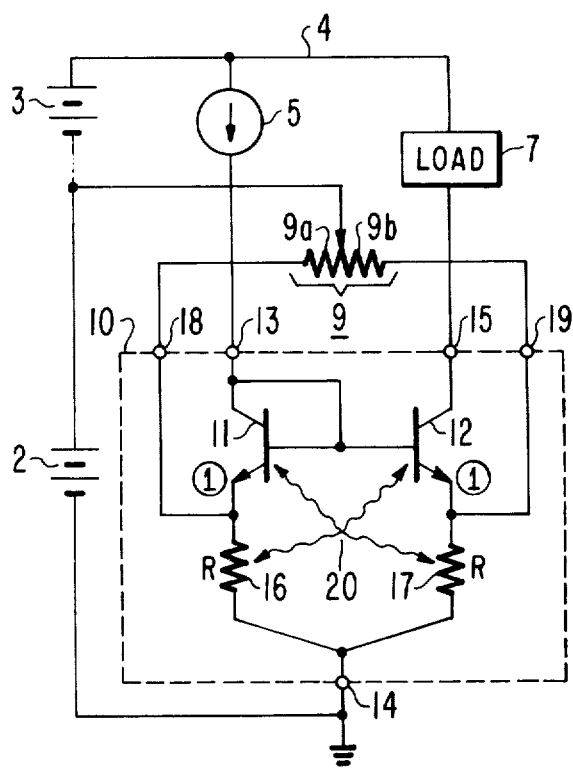
FIG. 1 is a schematic diagram of current mirror amplifier provided temperature-independent gain adjustment in accordance with the present invention.

In FIG. 1, current mirror amplifier 10 has an inut port between its input terminal 13 and common terminal 14 and has an output port between common terminal 14 and output terminal 15. Serially connected potential supplies 2 and 3 are connected between the common terminal 14 and a bus 4 to apply an operating potential to bus 4. A source 5 of input current is connected to the input terminal 13 of amplifier 10 and may, as shown, have its other terminal referred to bus 4. A load 7 connects output terminal 15 to bus 4 and has a direct current conductive path therethrough for supplying collector current to transistor 12. The connections set forth in this paragraph typify the way in which a current mirror amplifier is connected in the prior art.

Transistors 11 and 12 have their respective collector electrodes galvanically coupled to input terminal 13 and to output terminal 15, respectively; each of these galvanic couplings is shown as consisting of a direct connection in FIG. 1, but other forms of galvanic coupling may be employed. The emitter electrodes of transistors 11 and 12 are galvanically coupled to the common terminal 14 via resistances 16 and 17, respectively. Elements 11, 12, 16 and 17 are operated at substantially the same temperature by reason of mutual thermal coupling 20 amongst them.

Transistor 11 is provided with direct coupled collector-to-base feedback to adjust its base potential to such value as to condition its collector-to-emitter path to conduct the input current supplied to input terminal 13, except for the small portion thereof used to sustain base current flows in transistors 11 and 12. This collector-to-base feedback is shown in FIG. 1 as being applied by direct connection, but alternative circuits for applying the feedback may be employed—e.g., an emitter-or source-follower transistor. Means are provided for applying a base potential to transistor 12 which is the same as that applied to transistor 11; in FIG. 1, this means is shown as comprising the direct connection of the base electrodes of transistors 11 and 12.

The emitter electrodes of transistors 11 and 12 are connected to terminals 18 and 19, respectively. Potentiometer 9 has its end terminals connected at terminal 18 and at terminal 19, respectively. The adjustable tap-point terminal of potentiometer 9 is biased with respect to common terminal 14 of amplifier 10 such that (a) the resultant current flowing through segment 9a of its resistive body thereafter flows through resistor 16 in the same direction as the emitter current flow of transistor 11 and (b) the resultant current flow through segment 9b of its resistive body thereafter flows through resistor 17 in the same direction as the emitter current flow of transistor 12. Potential supply 2 may be used to apply this potential between common terminal 14 and the adjustable tap-point terminal of potentiometer 9, as shown. Alternatively, the adjustable tap-point terminal may be connected to bus 4 and the battery of potential supplies 2 and 3 replaced by a single potential supply.

For purposes of explaining the present invention, the base currents of transistors 11 and 12 are assumed to be negligibly small as compared to their collector currents. For integrated-circuit transistors of vertical structure, this is a close approximation since common-emitter forward current gains ($h_{fe}$'s) in excess of 70 or so are easily attained in the manufacture of such transistors. For lower-$h_{fe}$ transistors, the same result can be obtained by applying direct coupled collector-to-base feedback to transistor 11 via a source-follower field effect transistor or via an emitter-follower bipolar transistor. So, as a good approximation, the current gain G of current mirror amplifier 10 can be expressed as a ratio between the collector currents $I_{C11}$ and $I_{C12}$ of transistors 11 and 12, respectively.

$$G = -I_{C12}/I_{C11} \tag{1}$$

One skilled in the art of designing electronic circuits with transistors will be able to modify appropriately the teachings below in situations where low-$h_{fe}$ transistors require taking their base currents into account.

Transistors 11 and 12 like any other bipolar transistors can have their operation quite accurately described by the following well-known equation.

$$V_{BE} = (kT/q) \ln I_C/J_S A \tag{2}$$

where:
$V_{BE}$ is the base-emitter potential of the transistor,
k is Boltzmann's constant,
T is the absolute temperature of the transistor,
q is the charge on an electron,
$I_C$ is the collector current of the transistor, and
$J_S$ is the collector current of the transistor under $V_{BE} = 0$ conditions, divided by the effective area A of the base-emitter junction of the transistor. The constants k and q are universal, applying to all transistors. Transistors 11 and 12 are operated at substantially the same absolute temperature T. They are made of the same basic semiconductor material, preferably by the same diffusion and/or ion implantation steps and are assumed to have the same value of $J_S$. $V_{BE}$, $I_C$ and A will be subscripted with the identification numeral of the transistor.

In the drawing, the areas of the base-emitter junctions of transistors, expressed in arbitrarily chosen units of area, are indicated by encircled terms near the emitter electrodes of the respective transistors. The encircled numbers near the emitter electrodes of transistors 11 and 12 in current mirror amplifier 10 of FIG. 1 are each unity, giving rise to equation 3.

$$A_{11} = A_{12} \tag{3}$$

Equation 2 can be written to describe each of transistors 11 and 12 as follows:

$$V_{BE11} = (kT/q)\ln(I_{C11}/J_S A_{11}) \tag{4}$$

$$V_{BE12} = (kT/q)\ln(I_{C12}/J_S A_{12}) \tag{5}$$

The difference between $V_{BE12}$ and $V_{BE11}$ can be determined to be proportional to the logarithm of $I_{C11}$ and $I_{C12}$ by combining equations 4 and 5 as follows:

$$\begin{aligned}(V_{BE12} - V_{BE11}) &= (kT/q)\ln(A_{11}/A_{12}) + (kT/q)\ln(I_{C12}/I_{C11}) \\ &= (kT/q)\ln 1 + (kT/q)\ln(I_{C12}/I_{C11}) \\ &= (kT/q)\ln(I_{C12}/I_{C11}) \end{aligned} \tag{6}$$

Note that so long as the potential $V_{BE12} - V_{BE11}$ changes linearly with T, but is otherwise unchanging, $\ln(I_{C12}/I_{C11})$ and thus $G = -I_{C12}/I_{C11}$ is invariant. One may change $-I_{C12}/I_{C11}$ to a new value by changing the constant of proportionality between $(V_{BE12} - V_{BE11})$ and T. But so long as $(V_{BE12} - V_{BE11})$ is made to change proportionally with temperature with the new constant of proportionality, the current gain $G = -I_{C12}/I_{C11}$ will still be maintained despite temperature change.

The current gain G of current mirror amplifier 10 is controlled by changing the setting of the potentiometer 9. Decreasing the resistance of segment 9a and increasing the resistance of segment 9b will decrease $V_{BE11}$ relative to $V_{BE12}$, reducing $I_{C11}$ relative to $I_{C12}$, and so increase the current gain G of current mirror amplifier 10. On the other hand, decreasing the resistance of segment 9b and increasing the resistance of segment 9a will decrease $V_{BE12}$ relative to $V_{BE11}$, reducing $I_{C12}$ relative to $I_{C11}$, and so decrease the current gain of current mirror amplifier 10.

In current mirror amplifier 10, the following observation can be made, where $V_{16}$ and $V_{17}$ are the potential drops across resistances 16 and 17, respectively.

$$V_{BE11} + V_{16} = V_{BE12} + V_{17} \tag{7}$$

Therefore, $$V_{BE12} - V_{BE11} = V_{16} - V_{17} \tag{8}$$

If the differences between $V_{16}$ and $V_{17}$ can be made to change in proportion to T, then current mirror amplifier 10 should exhibit substantially fixed current gain despite change in T because $V_{BE12} - V_{BE11}$ will have the desired relationship to T.

The difference between $V_{16}$ and $V_{17}$ can be made to change in proportion to T in the following way, per the present invention. The normal range of operating absolute temperature T for a transistor includes a particular temperature $T_0$ somewhat above room temperature which may be considered the norm during operation—$T_0$ being, for instance, 333° Kelvin. If one applies a constant temperature-independent current to a resistance with a coefficient of change per degree Kelvin of change in absolute temperature equal to $+1/T_0$, the potential drops across that resistance will increase pretty much in proportion to T—that is, by about 0.3%/°K where T is about 333° K. The difference between two such potential drops will similarly increase pretty much in proportion to T.

The resistances of elements 16 and 17 are made to exhibit resistances with a positive coefficient of change with temperature substantially proportional to 1/T0— that is, about +0.3%/°K. This is easily done in a monolithic integrated circuit by fabricating resistances 16 and 17 by ion implantation. The conventional diffused resistor, the so-called "B&R" resistor, formed concurrently with the base regions of vertical-structure transistors, in most standard monolithic integrated-circuit fabrication processes is formed of silicon with a sufficiently high impurity concentration to exhibit only about +0.22%/°K coefficient of change in resistance with change in temperature. The so-called "pinch" resistor formed from a doubly diffused structure in silicon, the diffusions being concurrent with those forming the base and emitter regions respectively of vertical-structure transistors, exhibit a +0.375%/°K coefficient of change in resistance with change in temperature, however. So, connection of a B&R resistor and a pinch resistor of suitable resistance ratios in parallel or in series will result in a composite resistor having close to the desired +0.3%/°K coefficient of change in resistance with change in temperature.

The two temperature-independent current sources used for developing drops $V_{16}$ and $V_{17}$ across resistances 16 and 17, respectively, together comprise potential supply 2 and potentiometer 9 in the FIG. 1 circuit. The resistances of segments 9a and 9b of potentiometer 9 are made much larger than the resistances 16 and 17, respectively, and the potential afforded by supply 2 is made sufficiently large that the current through resistances 9a and 16 substantially exceeds the emitter current of transistor 11 and that the current through resistances 9b and 17 substantially exceeds the emitter current of transistor 12. Then, $V_{16}$ and $V_{17}$ will be negligibly small compared to the potential $V_2$ from supply 2, and the currents $I_{9a}$ and $I_{9b}$ through potentiometer segments 9a and 9b, respectively, are determined in accordance with Ohm's Law to be to good approximation as follows.

$$I_{9a} = (V_2/R_{9a}) \quad (9)$$

$$I_{9b} = (V_2/R_{9b}) \quad (10)$$

If $R_{9a}$ and $R_{9b}$ exhibit a coefficient of resistance change with temperature change equal to the coefficient of voltage change with temperature change exhibited by $V_2$, the $I_{9a}$ and $I_{9b}$ will exhibit substantially zero coefficients of change with temperature change. This can be done as described below in connection with FIG. 7. It is usually simpler, however, to make $V_2$ temperature-independent and (a) to use a potentiometer 9 which exhibits a zero coefficient of resistance change with temperature change or (b) to maintain the potentiometer 9 at constant temperature.

Figure 2:
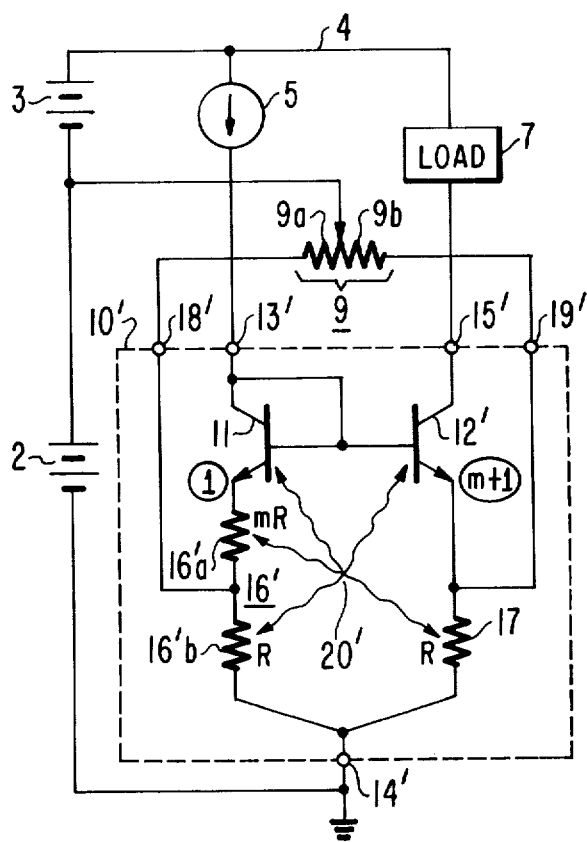
FIGS. 2 and 3 are schematic diagrams of modifications of FIG. 1.

FIG. 2 shows how the FIG. 1 current mirror amplifier 10 may be modifed to form a current mirror amplifier 10' having a current gain of $-(m+1)$, where $m$ is a positive number. Transistor 12' has a base-emitter junction with an effective area $(m+1)$ times as large as that of the base-emitter junction of transistor 11. The emitter degeneration resistance 16' of transistor 11 is in two segments 16'a and 16'b which have respective resistances m times and unity times, respectively, as large as the emitter degeneration resistance 17 of transistor 12'. These foregoing connections in current mirror amplifier 10' condition its transistor 12' to have a collector current $I_{C12'}$, nominally $(m+1)$ times the collector current $I_{C11}$ of transistor 11, absent current flows via potentiometer 9 to terminals 18' and 19'.

Now, as long as the emitter current flows in a pair of transistors are logarithmically related to their respective base-emitter potentials, per equations 4 and 5, they will experience the same percentage change in their collector currents for a given incremental change in each of their base-emitter potentials no matter what their respective current levels. This can be seen by simply differentiating equations 4 and 5 and comparing them. To operate potentiometer 9 about in the center of its range of setting, while its one end terminal is still connected to the end of resistance 17 remote from common terminal 14, its other end is connected—not to the end of resistance 16' remote from common terminal 14 (which can alternatively be done)—but rather to a tap point on resistance 16' having a resistance R to common terminal 14.

Figure 3:
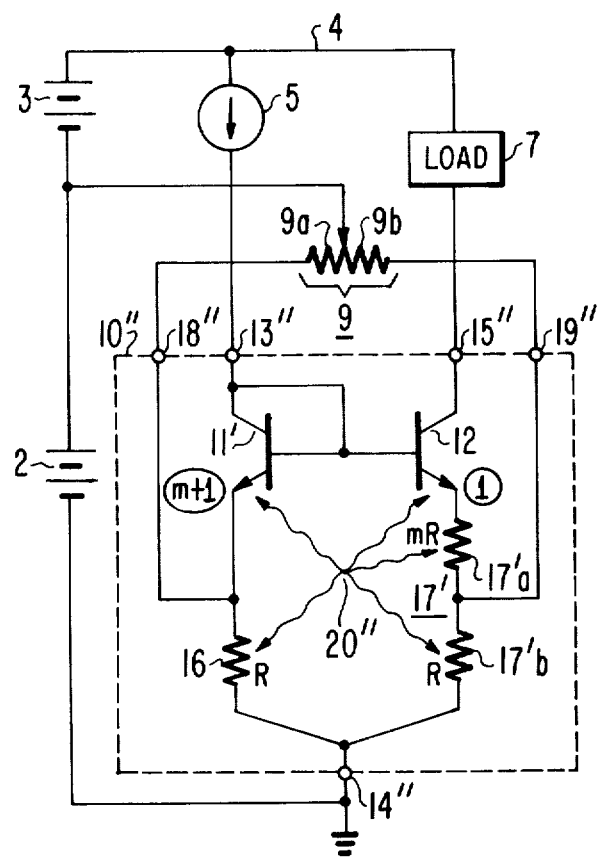

FIG. 3 shows how the FIG. 1 current mirror amplifier may be modified to form a current mirror amplifier 10" having a current gain of $-11(m+1)$. Transistor 11' has a base-emitter junction with an effective area $(m+1)$ times as large as that of the base-emitter junction of transistor 12. The emitter degeneration resistance 17' of transistor 12 is in two segments 17'a and 17'b which have respective resistances m times and unity times, respectively, as large as the emitter degeneration resistance 16 of transistor 11'. These foregoing connections in current mirror amplifier 10" condition its transistor 12 to have a collector current $I_{C12}$ nominally $1/(m+1)$ times the collector current $I_{C11}$, of transistor 11', absent current flows via potentiometer 9 to terminals 18" and 19".

Figure 4:
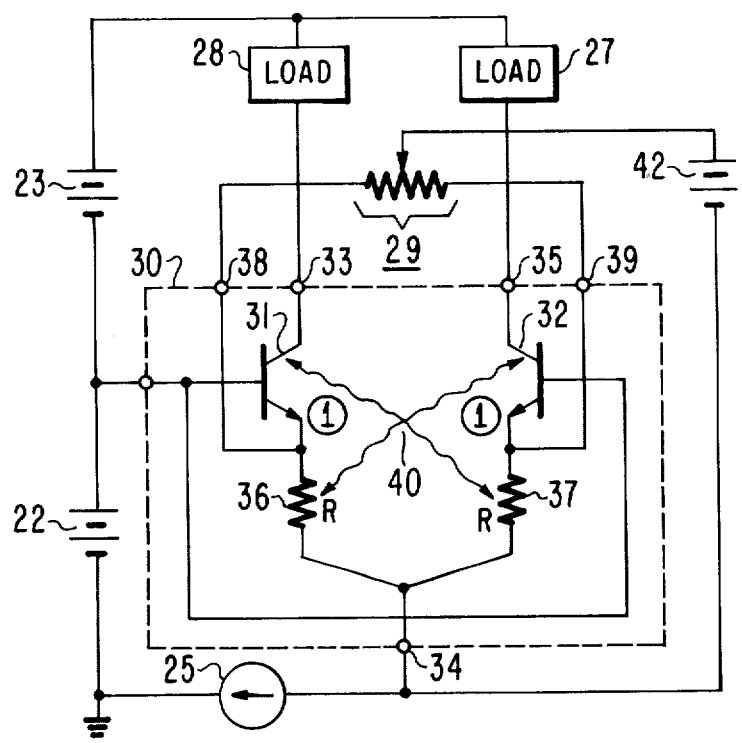
FIG. 4 is a schematic diagram of an emitter-coupled transistor pair used as a current divider, its division ratio being adjusted in accordance with the present invention.

The current divider 30 of FIG. 4 has transistors 31 and 32 operated under similar direct-current conditions as transistors 11 and 12 of current mirror amplifier 10. Transistors 31 and 32 have their base electrodes connected together to receive a bias potential provided at the interconnection of the positive and negative terminals of direct potential supplies 22 and 23, respectively. Transistors 31 and 32 have their respective emitter electrodes connected to a common terminal 34 via emitter degeneration resistances 36 and 37, respectively. The resistances of elements 36 and 37 are in inverse proportion to the areas of the base-emitter junctions of transistors 31 and 32, respectively. Elements 31, 32, 36 and 37 have mutual thermal coupling 40 amongst them.

The current demanded by current source 25 connecting terminal 34 to the negative terminal of supply 22 is supplied by the combined emitter currents of transistors 31 and 32 flowing in a ratio nominally equal to the ratio of their respective base-emitter junction areas. Responsive to their respective emitter currents $I_{E31}$ and $I_{E32}$ transistors 31 and 32 demand respective collector currents $I_{C31}$ and $I_{C32}$ from the positive terminal of supply 23. $I_{C31}$ and $I_{C32}$ are drawn through loads 28 and 27, respectively, and then through branch terminals 33 and 35, respectively. $I_{C31}$ and $I_{C32}$ are substantially equal to $I_{E31}$ and $I_{E32}$, respectively, except for the portions of $I_{E31}$ and $I_{E32}$ flowing as respective base currents. In any case, the ratio of $I_{C31}$ to $I_{C32}$ is the same as the ratio of $I_{E31}$ to $I_{E32}$.

The end terminals of potentiometer 29 are connected via terminals 38 and 39, respectively, to the emitter electrodes of transistors 31 and 32, respectively. Its adjustable tap-point terminal is offset from the potential at terminal 34 by a temperature-independent potential, shown as being provided by potential supply 42, whereby the relative values of $I_{C31}$ and $I_{C32}$ can be trimmed in the same way as the relative values of $I_{C11}$ and $I_{C12}$ are trimmed in the FIG. 1 current mirror amplifier 10.

Figure 5:
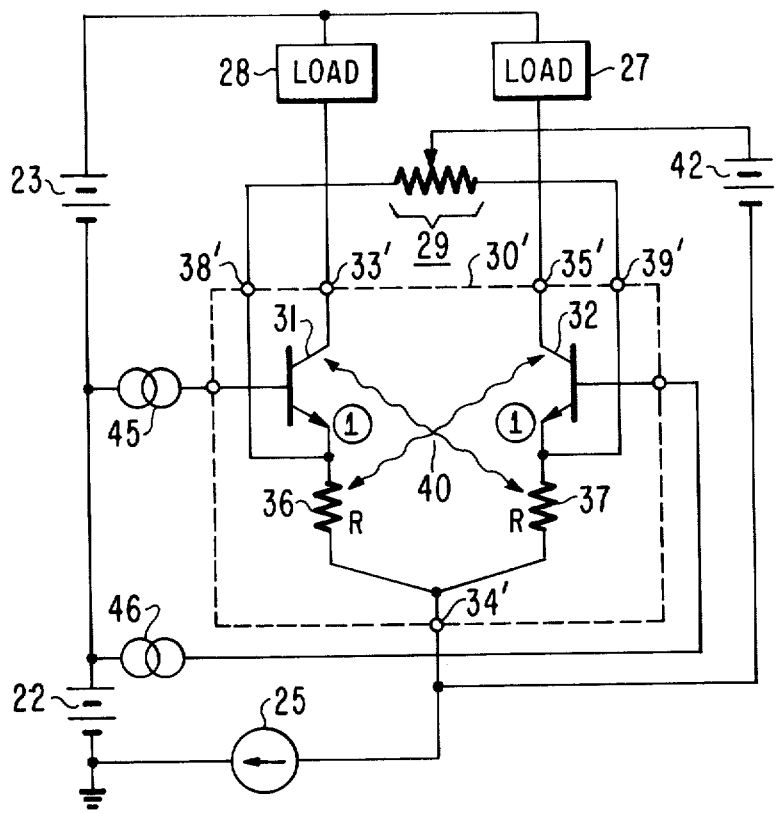
FIGS. 5 and 6 are schematic diagrams of differential amplifiers, each including a pair of emitter-coupled transistors having their relative quiescent collector current levels adjusted in accordance with the present invention.
Figure 6:
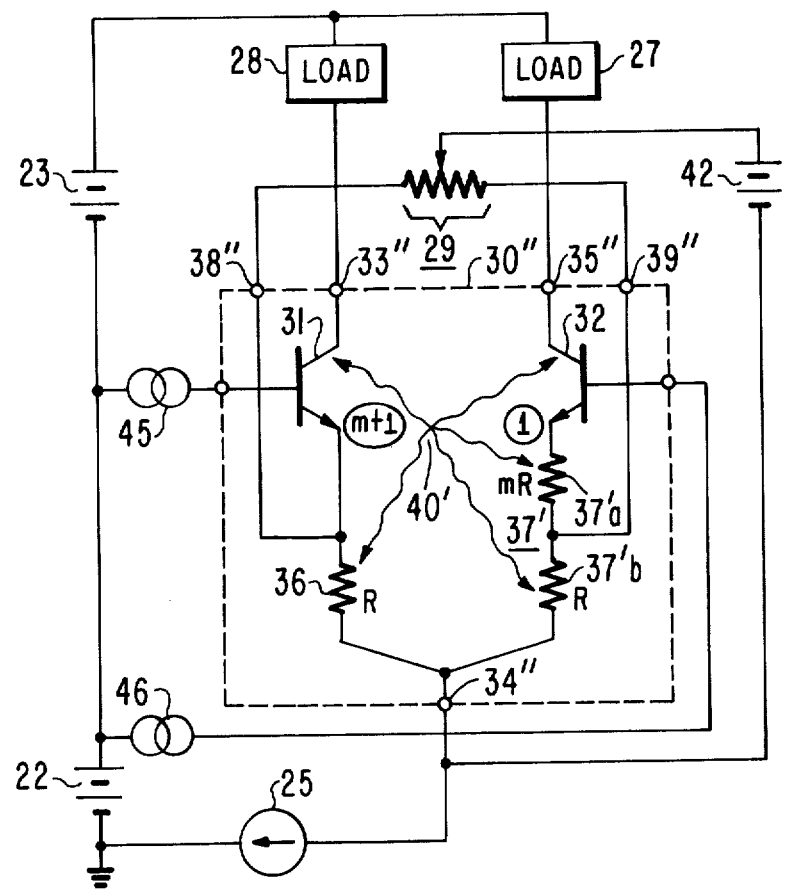

The current divider 30 provides the basic quiescent circuit equivalent for an emitter-coupled differential amplifier. All that is missing is means for applying input signal between the base electrodes of transistors 31 and 32. This can, for example, be done as shown in emitter-coupled differential amplifier 30' of FIG. 5, where balanced signal potential sources 45 and 46 are connected between the base electrodes of transistors 31 and 32, and are referred to the potential at the interconnection of supplies 22 and 23. FIG. 6 shows an unbalanced emitter-coupled differential amplifier having its degree of unbalance adjusted in the same manner as suggested for the current mirror amplifiers 10' and 10" of FIGS. 2 and 3.

In any of the apparatuses 10, 10', 10", 30 30', 30", a fixed resistor may replace segment 9a of potentiometer 9 and an adjustable resistor may replace segment 9b of potentiometer 9, or vice versa. Also, potentiometer 9 may be replaced by a potentiometer with stop resistors connecting its end terminals to terminals 18, 19; 18', 19';

18", 19", 38, 39; 38', 39'; or 38", 39" to provide for a reduced range of gain adjustment.

The temperature-independent potential applied between the adjustable tap terminal of potentiometer 9 and terminal 14 (or 14' or 14") may be supplied by a potential supply of opposite polarity from supply 2 it replaces in this function. Similar alternatives exist for the circuits shown in FIGS. 4–6.

The foregoing circuits shown in FIGS. 1–6 may also be constructed using potentiometers which are subjected to temperature changes and which exhibit variations in resistance with temperature. The problem is to make $V_2$ exhibit the same coefficient of change with temperature as potentiometer 9 or 29. This problem can be solved directly by developing $V_2$ across current-biased reference diodes having suitable temperature coefficients and being in close thermal coupling with the resistive body of the potentiometer.

Figure 7:
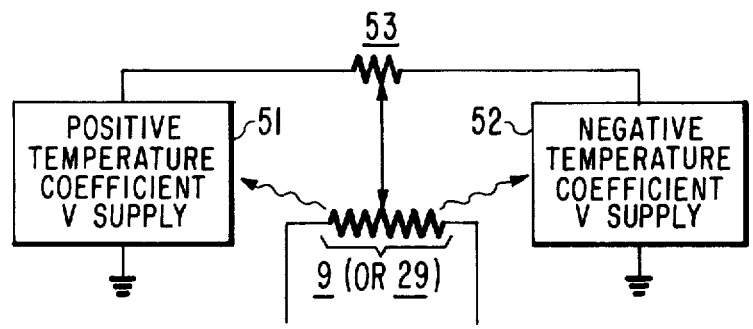
FIG. 7 is a schematic diagram, partially in block form, of a modification applicable to any of the circuits of FIGS. 1 - 6 to compensate for the potentiometer having a resistance with a temperature coefficient other than zero.

Or, as shown in FIG. 7, a positive-temperature coefficient supply 51 and a negative-temperature coefficient supply 52, each in close thermal coupling to the resistive body of potentiometer 9 (or 29), with a pair of serially connected resistances connected between them can be used to supply $V_2$ to the adjustable-tap point of potentiometer 9 (or 29). The serially connected resistances, here shown as segments of the resistive body of a potentiometer 53 are operated at the same temperature as each other and have the same temperature coefficients of resistance as each other. By properly proportioning these resistances, any temperature coefficient of potential intermediate to those of supplies 51 and 52 can be obtained for the potential $V_2$ applied to the adjustable-tap terminal of potentiometer 9 (or 29).

Figure 8:
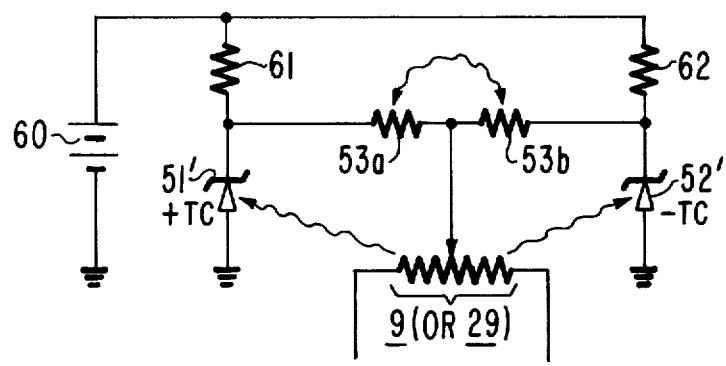
FIG. 8 is a schematic diagram of a representative realization of the FIG. 7 modification.

FIG. 8 shows a representative construction of the FIG. 7 circuit. Voltage-reference diodes 51' and 52' produce positive-and negative-temperature-coefficient offset potentials, respectively, in response to bias currents from a supply 60 of a potential in excess of their offset potentials via resistances 61 and 62, respectively. Potentiometer 53 is replaced by a fixed resistive potential divider comprising resistors 53a and 53b which are in close thermal coupling with each other and/or which have zero-temperature-coefficient resistances. Diodes 51' and 52' can be mounted directly on potentiometer 9 (or 29). Diode 51' can be replaced by an integrated temperature-dependent voltage reference circuit (e.g., of the sort described in U.S. Pat. No. 3,851,241). Diode 52' can be replaced by a multiple-$V_{BE}$ supply (e.g., of the sort described in either of U.S. Pat. Nos. 3,430,155 and 3,555,309).

What is claimed is:

1. A transistor amplifier comprising:
   first and second transistors of the same conductivity type, both fabricated from the same basic semiconductor material and operated at substantially the same absolute temperature T, each having an emitter-base junction between its emitter and base electrodes and a collector-base junction between its collector and base electrodes;
   first and second resistive elements, each operated at substantially said temperature T, each exhibiting a positive coefficient of change in resistance of approximately $1/T_0$ per degree of temperature change in a range of absolute temperature including $T_0$, said first resistive element having a first end connected to the emitter electrode of said first transistor and having a second end, said second resistive element having a first end connected to the emitter electrode of said second transistor and having a second end;
   an interconnection of the second ends of said first and said second resistive elements;
   means for applying substantially the same quiescent potentials to the base electrodes of said first and said second transistors, of a polarity respective to a potential at said interconnection for forward-biasing the base-emitter junction of said first and said second transistors;
   means for applying a quiescent potential to the collector electrode of said first transistor of a value respective to the quiescent potential at its base electrode to prevent substantial forward conduction across the collector-base junction of said first transistor and to condition it for normal transistor operation;
   means for applying a quiescent potential to the collector electrode of said transistor of a value respective to the quiescent potential at its base electrode to prevent substantial forward conduction across the collector-base junction of said second transistor and to condition it for normal transistor operation; and
   first and second sources of temperature-independent currents, at last one of which is adjustable, said first current source being connected in loop with said first resistive element and said second current source being connected in loop with said second resistive element.

2. A transistor amplifier as set forth in claim 1 wherein said first and said second sources of temperature-independent currents together comprise:
   a potentiometer having a resistive body between first and second end terminals respectively connected to the first end of said first resistive element and to the first end of said second resistive element and having an adjustable tap-point terminal on its resistive body, the resistance of its said resistive body being substantially invariant with change in its temperature; and
   a supply of potential with fixed value connected between the adjustable tap-point terminal of said potentiometer and said interconnection of the second ends of said first and said second resistive elements.

3. A transistor amplifier as set forth in claim 2 wherein said supply of potential with fixed value is poled such as to cause currents to flow through said potentiometer and through said first and said second resistive elements respectively to flow in the same direction as the emitter current of said first transistor through said first resistive element and in the same direction as the emitter current of said second transistor through said second resistive element.

4. A transistor as set forth in claim 1 wherein said first and said second sources of temperature-independent currents together comprise:
   a potentiometer having a resistive body between first and second end terminals respectively connected to the first end of said first resistive element and to the first end of said second resistive element and having an adjustable tap-point terminal on its resistive body, the resistance of its said resistive body exhibiting a coefficient of change with change in its temperature; and
   a supply of potential exhibiting substantially the same coefficient of change with temperature of said potentiometer as the resistance of said potentiometer, said supply of potential connected between the tap-point terminal of said potentiometer and said interconnection of the second ends of said first and said second resistive elements.

5. A transistor amplifier as set forth in claim 4 wherein said supply of potential with fixed value is poled such as to cause currents to flow through said potentiometer and through said first and said second resistive elements respectively to flow in the same direction as the emitter current of said first transistor through said first resistive element and in the same direction as the emitter current of said second transistor through said second resistive element.

6. A transistor amplifier for operation in a range of temperature around an absolute temperature $T_0$, said amplifier comprising:

first and second transistors, each having base and emitter electrodes with a base-emitter junction therebetween and having a collector electrode;

means for maintaining said base electrodes at substantially the same quiescent potential;

a common terminal;

a first resistance connecting the emitter electrode of said first transistor to said common terminal and having a positive temperature coefficient $1/T_0$;

a second resistance connecting the emitter electrode of said second transistor to said common terminal and having a positive temperature coefficient $1/T_0$;

means providing mutual thermal coupling amongst said first transistor, said second transistor, said first resistance and said second resistance for maintaining them at substantially the same operating temperature; and means other than said transistors for applying temperature independent currents to said two resistance means, in a desired ratio, for controlling the gain of said amplifier.

* * * * *